(12) United States Patent
Lee

(10) Patent No.: US 8,520,466 B2
(45) Date of Patent: *Aug. 27, 2013

(54) INTERNAL COMMAND GENERATION CIRCUIT

(75) Inventor: Kyong Ha Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/560,370

(22) Filed: Jul. 27, 2012

(65) Prior Publication Data

US 2012/0294106 A1 Nov. 22, 2012

Related U.S. Application Data

(63) Continuation of application No. 12/826,906, filed on Jun. 30, 2010, now Pat. No. 8,254,202.

(30) Foreign Application Priority Data

Nov. 30, 2009 (KR) ........................ 10-2009-0117114

(51) Int. Cl.
*G11C 8/00* (2006.01)

(52) U.S. Cl.
USPC .............. 365/233.18; 365/233.1; 365/189.11

(58) Field of Classification Search
USPC .............. 365/233.18, 233.1, 189.11, 230.08, 365/240
See application file for complete search history.

(56) References Cited

U.S. PATENT DOCUMENTS 7,609,584 B2 * 10/2009 Kim et al. ................ 365/233.18
8,254,202 B2 * 8/2012 Lee .......................... 365/233.18

\* cited by examiner

*Primary Examiner* — David Lam
(74) *Attorney, Agent, or Firm* — William Park & Associates Patent Ltd.

(57) ABSTRACT

The internal command generation circuit includes a burst pulse generation unit and a pulse shifting unit. The burst pulse generation unit is configured to receive a command for a read or write operation, and generate a first burst pulse. The pulse shifting unit is configured to shift the first burst pulse and generate an internal command.

5 Claims, 7 Drawing Sheets

INTERNAL COMMAND GENERATION CIRCUIT

CROSS-REFERENCES TO RELATED APPLICATIONS

The present application claims priority under 35 U.S.C 119(a) to Korean application number 10-2009-0117114, filed on Nov. 30, 2009, in the Korean Intellectual Property Office, which is incorporated herein by reference in its entirety set forth in full.

BACKGROUND

The present invention relates to an internal command generation circuit.

As is well known, a double data rate (DDR) memory device is designed to input or output data in synchronization with both rising and falling edges of a system clock. A DDR memory device operates in a burst mode in order to effectively perform successive read or write operations.

In a burst mode, BL4, BL8, and BL16 are provided. BL4 refers to a mode in which a burst length is set to 4 and 4-bit data are inputted or outputted in response to a single command. BL8 refers to a mode in which a burst length is set to 8 and 8-bit data are inputted or outputted in response to a single command. BL16 refers to a mode in which a burst length is set to 16 and 16-bit data are inputted or outputted in response to a single command.

A DDR memory device uses a prefetch function. Typically, a DDR memory device applies a 2-bit prefetch to input or output 2-bit data successively. A DDR2 memory device applies a 4-bit prefetch to input or output 4-bit data successively.

In a read or write operation, a semiconductor memory device generates an internal command whose pulse number is determined depending on a set burst mode. More specifically when a burst mode is set to BL4, an internal command having no pulse is generated. When a burst mode is set to BL8, an internal command having one pulse is generated. When a burst mode is set to BL16, an internal command having three pulses is generated.

This is because when a read or write command is inputted for a read or write operation in a DDR2 memory device to which a 4-bit prefetch is applied, 4-bit data are basically inputted or outputted successively, and 4-bit data are inputted or outputted successively whenever a pulse of an internal command is generated.

SUMMARY

The present invention relates to an internal command generation circuit which is capable of reducing current consumption.

In one embodiment, an internal command generation circuit includes: a burst pulse generation unit configured to receive a command for a read or write operation, and generate a first burst pulse including a plurality of pulses; and a pulse shifting unit configured to shift the first burst pulse and generate an internal command.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of the invention.

Figure 1:
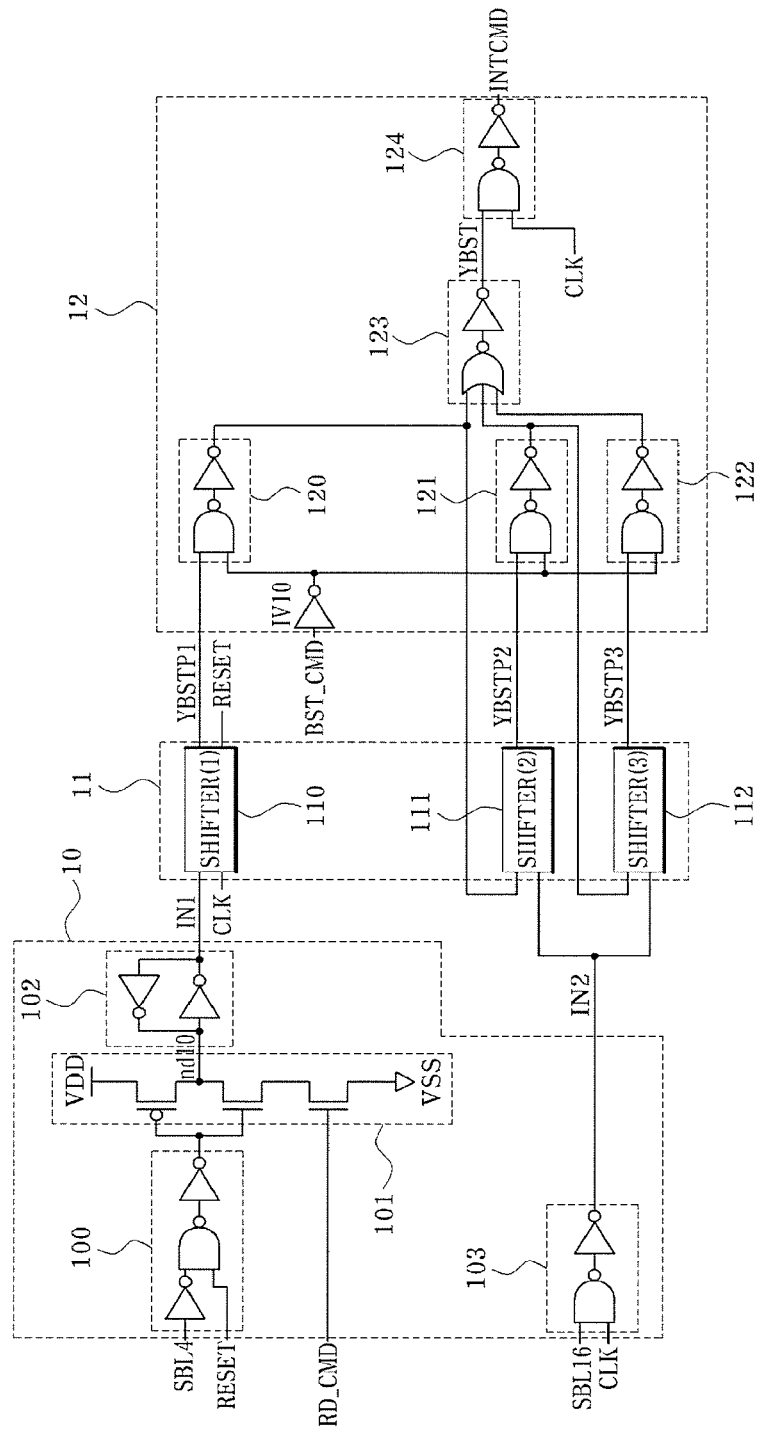
FIG. 1 is a circuit diagram of an internal command generation circuit according to an embodiment of the present invention.

FIG. 1 is a circuit diagram of an internal command generation circuit according to an embodiment of the present invention.

Referring to FIG. 1, an internal command generation circuit according to an embodiment of the present invention includes an input signal generation unit 10, a pulse generation unit 11, and an internal command generation unit 12.

The input signal generation unit 10 includes a first logic unit 100, a driver unit 101, a latch unit 102, and a second logic unit 103. The first logic unit 100 is configured to receive a first burst signal SBL4 and a reset signal RESET and perform a logic operation on the received signals SBL4 and RESET. The driver unit 101 is configured to drive a node nd10 in response to an output signal of the first logic unit 100 and a read command RD_CMD. The latch unit 102 is configured to latch a signal of the node nd10 and transfer the latched signal as a first input signal IN1. The second logic unit 103 is configured to transfer a second burst signal SBL16 as a second input signal IN2 in a time period in which a clock signal CLK is at a high level. The first burst signal SBL4 is a signal which is enabled to a high level when a burst length is set to 4, and the second burst signal SBL16 is a signal which is enabled to a high level when a burst length is set to 16. The reset signal RESET is a signal which is reset to a high level.

Figure 2:
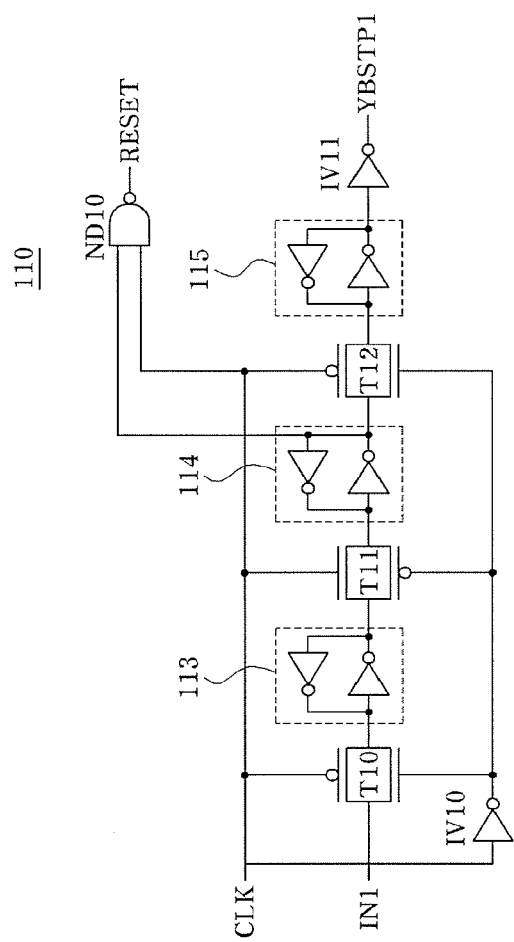
FIG. 2 is a circuit diagram of a first shifter illustrated in FIG. 1.

The pulse generation unit 11 includes a first shifter 110, a second shifter 111, and a third shifter 112. As illustrated in FIG. 2, the first shifter 110 includes a plurality of transfer gates T10 to T12, a plurality of latches 113 to 115, an inverter IV11, and a NAND gate ND10. When the first input signal IN1 of a high level is inputted, the first shifter 110 generates the reset signal RESET of a high level, and generates a first pulse signal YBSTP1 including a pulse which is enabled to a high level during one cycle of the clock signal CLK. As illustrated in FIG. 1, when the second input signal IN2 of a high level is inputted, the second shifter 111 shifts the first pulse signal YBSTP1 by two cycles of the clock signal CLK, and outputs the shifted pulse signal as a second pulse signal YBSTP2. In addition, when the second input signal IN2 of a high level is inputted, the third shifter 112 shifts the second pulse signal YBSTP2 by two cycles of the clock signal CLK, and outputs the shifted signal as a third pulse signal YBSTP3.

The internal command generation unit 12 includes a first logic unit 120, a second logic unit 121, a third logic unit 122, a fourth logic unit 123, and a fifth logic unit 124. The first logic unit 120 is configured to receive an inverted signal of a burst command BST_CMD and the first pulse signal YBSTP1, and the second logic unit 121 is configured to receive the inverted signal of the burst command BST_CMD and the second pulse signal YBSTP2. The third logic unit 122 is configured to receive the inverted signal of the burst command BST_CMD and the third pulse signal YBSTP3, and the fourth logic unit 123 is configured to receive output signals of the logic units 120 to 122, and output a fourth pulse signal YBST. The fifth unit 124 is configured to receive the fourth pulse signal YBST and the clock signal CLK, and generate an internal command INTCMD. The internal command generation unit 12, configured as above, transfers the first to third pulse signals YBSTP1 to YBSTP3 as the fourth pulse signal YBST when the burst command BST_CMD is at a low level, and transfers the fourth pulse signal YBST as the internal command INTCMD when the clock signal CLK is at a high level. The burst command BST_CMD is an interrupt signal which is applied from an external circuit in order to interrupt the generation of the internal command INTCMD in the read operation.

The operation of the internal command generation circuit, configured as above, will be described below, based on burst modes BL4, BL8 and BL16.

In the case of burst mode BL4, that is, when a burst length is set to 4, the first burst signal SBL4 is at a high level, and the second burst signal SBL16 is at a low level. Thus, the input signal generation unit 10 generates the first input signal IN1 of a low level and the second input signal IN2 of a low level. Consequently, the first to third pulse signals YBSTP1 to YBSTP3 generated from the pulse generation unit 11 are maintained at a low level, and thus, the internal command INTCMD outputted from the internal command generation unit 12 is maintained at a low level.

In the case of burst mode BL8, since both of the first burst signal SBL4 and the second burst signal SBL16 are at a low level, the input signal generation unit 10 generates the first input signal IN1 of a high level and the second input signal IN2 of a low level. When one and a half cycle of the input clock signal CLK elapses from the input of the read command RD_CMD, the pulse generation unit 11 generates the first pulse signal YBSTP1 which includes a pulse having a pulse width corresponding to one cycle of the clock signal CLK. Since the internal command generation unit 12 transfers the pulse of the first pulse signal YBSTP1 as the internal command INTCMD, the internal command INTCMD having one pulse is generated.

Figure 3:
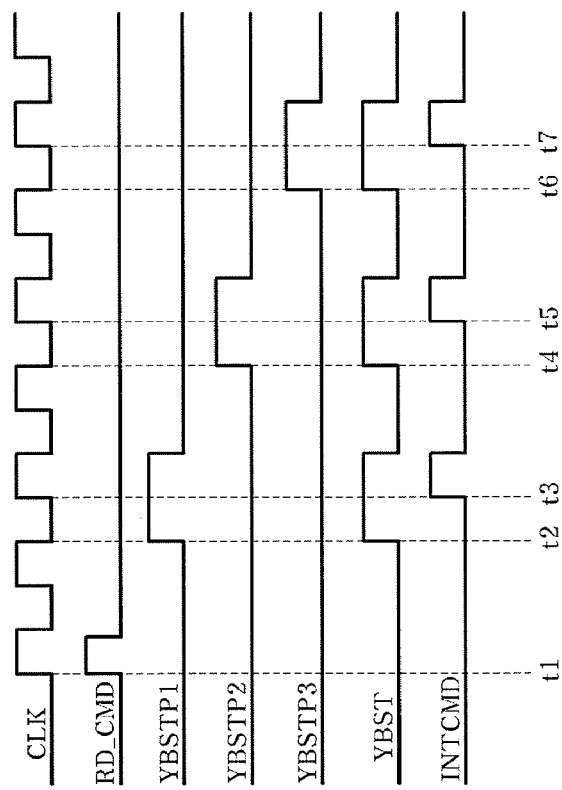
FIG. 3 is a timing diagram showing the operation of the internal command generation circuit illustrated in FIG. 1.

The operation in the case of BL16 will be described below in more detail with reference to FIG. 3. Referring to FIG. 3, in the case of burst mode BL16, the first burst signal SBL4 is at a low level and the second burst signal SBL16 is at a high level. Thus, when the read command RD_CMD is inputted at time t1, the input signal generation unit 10 generates the first input signal IN1 of a high level and the second input signal IN2 of a high level. When the first input signal IN1 of the high level is inputted, the first shifter 110 generates the reset signal RESET of a low level, and thus, the first input signal IN1 changes to a low level when one cycle of the clock signal CLK elapses. Therefore, the first shifter 110 shifts the first input signal IN1 in synchronization with the clock signal CLK, and generates the first pulse signal YBSTP1 which includes a pulse having a pulse width corresponding to one cycle of the clock signal CLK at time t2. In addition, the second shifter 111 shifts the first pulse signal YBSTP1 by two cycles of the clock signal CLK and outputs the shifted pulse signal as the second pulse signal YBSTP2, and the third shifter 112 shifts the second pulse signal YBSTP2 by two cycles of the clock signal CLK and outputs the shifted pulse signal as the third pulse signal YBSTP3. Therefore, the fourth pulse signal YBST generated from the internal command generation unit 12 includes pulses having a pulse width corresponding to one cycle of the clock signal CLK at times t2, t4 and t6, and the internal command INTCMD generated from the internal command generation unit 12 includes pulses having a pulse width corresponding to a half cycle of the clock signal CLK at times t3, t5 and t7.

The construction and operation of the internal command generation circuit have been described above while being limited to the circuit which generates the internal command INTCMD in the read operation. However, it is apparent to those skilled in the art that an internal command generation circuit for generating an internal command in a write operation can be easily derived from the internal command generation circuit set forth above as the exemplary embodiment of the present invention by replacing the read command RD_CMD inputted to the input signal generation unit 10 with a write command WT_CMD which is enabled to a high level in a write operation.

Figure 4:
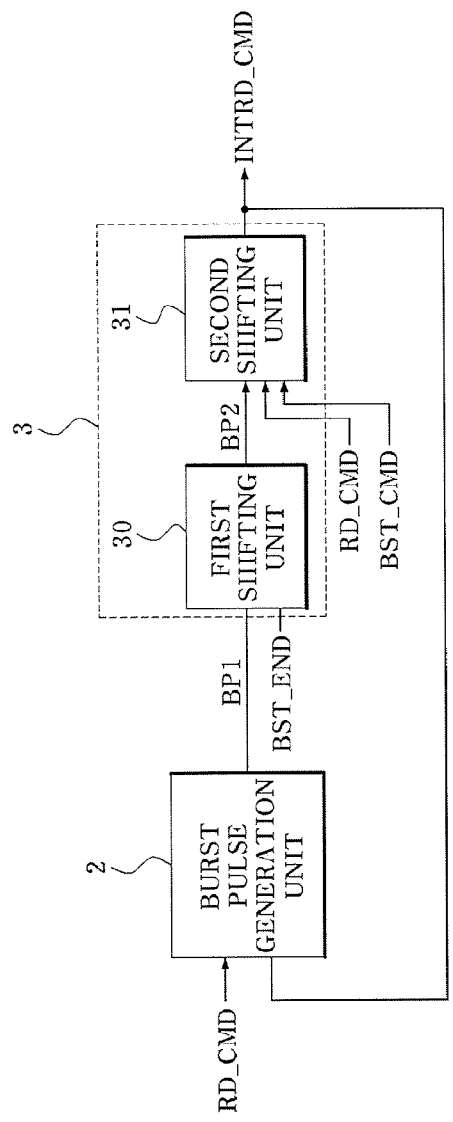
FIG. 4 is a circuit diagram of an internal command generation circuit according to another embodiment of the present invention.

FIG. 4 is a circuit diagram of an internal command generation circuit according to another embodiment of the present invention.

Referring to FIG. 4, an internal command generation circuit according to another embodiment of the present invention includes a burst pulse generation unit 2 and a pulse shifting unit 3.

Figure 5:
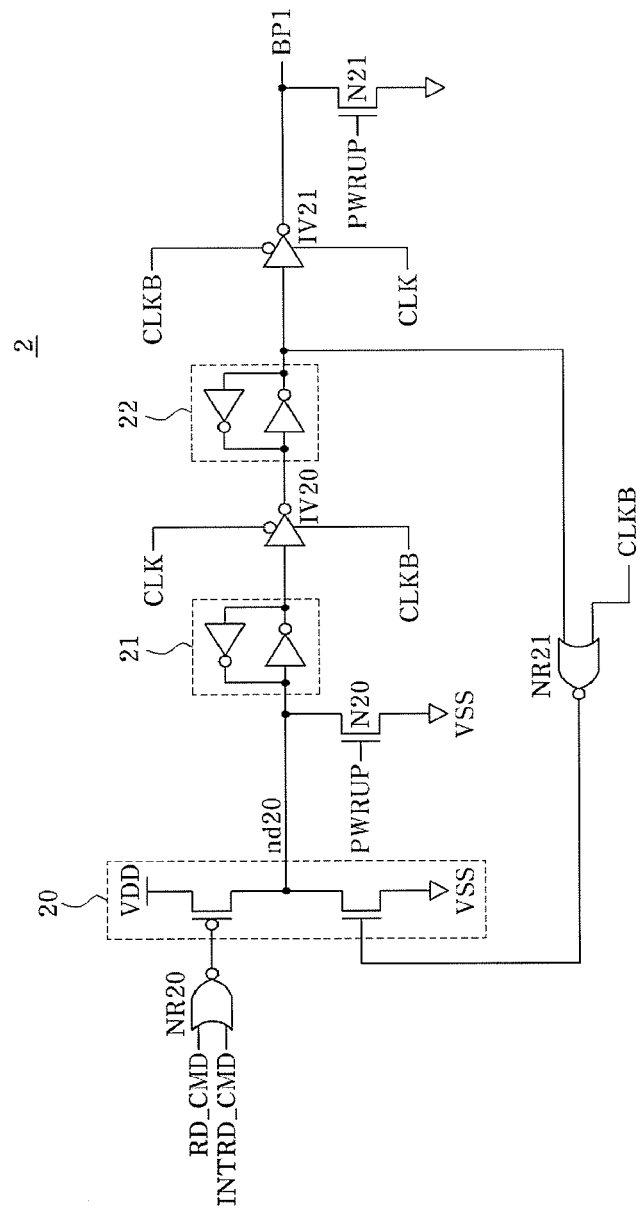
FIG. 5 is a circuit diagram of a burst pulse generation unit included in the internal command generation circuit illustrated in FIG. 4.

As illustrated in FIG. 5, the burst pulse generation unit 2 includes a first NOR gate NR20, a first driver unit 20, a first NMOS transistor N20, a first latch unit 21, a first inverter IV20, a second latch unit 22, a second NOR gate NR21, a second inverter IV21, and a second NMOS transistor N21. Specifically, the first NOR gate NR20 is configured to receive a read command RD_CMD and an internal command INTRD_CMD and perform a NOR operation thereon. The first driver 20 is configured to receive an output signal of the first NOR gate NR20 and an output signal of the second OR gate NR21, and drive a node nd20. The first NMOS transistor N20 is configured to reset the node nd20 to a ground voltage VSS in response to a power-up time period PWRUP. The first latch unit 21 is configured to latch a signal of the node nd20. The first inverter IV20 is configured to buffer an output signal of the first latch unit 21 in response to a clock signal CLK. The second latch unit 22 is configured to latch an output signal of the first inverter IV20. The second NOR gate NR21 is configured to receive an output signal of the second latch unit 22 and an inverted clock signal CLKB, and perform a NOR operation thereon. The second inverter IV21 is configured to buffer the output signal of the second latch unit 22 in response to the clock signal CLK. The second NMOS transistor N21 is configured to reset a first burst pulse BP1 to the ground voltage VSS in response to the power-up time period PWRUP.

The burst pulse generation unit 2 configured as above generates the first burst pulse BP1 which includes a pulse having a pulse width corresponding to one cycle of the clock signal CLK when one cycle of the clock signal CLK elapses after a high level pulse of the read command RD_CMD is inputted. More specifically, when the high level pulse of the read command RD_CMD is inputted, the driver unit 20 drives the node nd20 to a high level, and the signal of the node nd20 driven to the high level is transferred as the first burst pulse BP1 through the first inverter IV20 driven in response to the low-level clock signal CLK and the second inverter IV21 driven in response to the high-level clock signal CLK. Due to the signal of the node nd20 driven to the high level, the second latch unit 22 outputs a low level signal, and the second NOR gate NR21 outputs a high level signal in a time period in which the inverted clock signal CLKB is at a low level. Thus, the driver unit 20 drives the node nd20 to a low level. The signal of the node nd20 driven to the low level is transferred as the first burst pulse BP1 through the first and second inverters IV20 and IV21 when one cycle of the clock signal CLK elapses.

Figure 6:
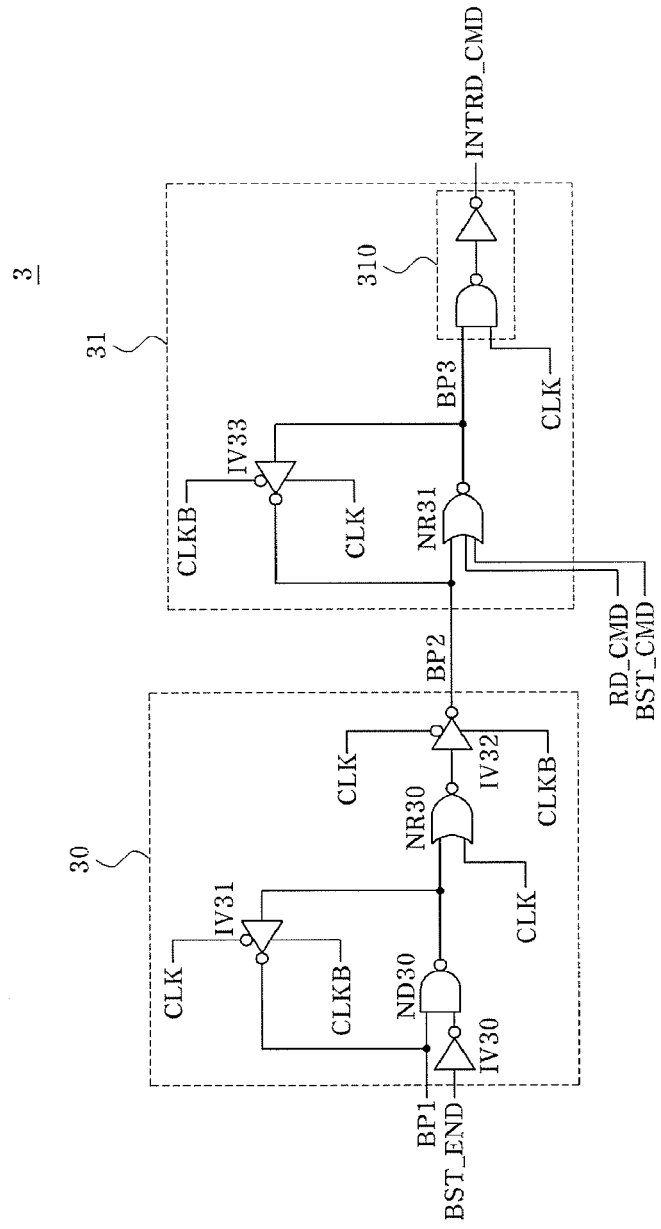
FIG. 6 is a circuit diagram of a pulse shifting unit included in the internal command generation circuit illustrated in FIG. 4.

As illustrated in FIG. 6, the pulse shifting unit 3 includes a first shifting unit 30 and a second shifting unit 31.

The first shifting unit 30 includes a NAND gate ND30, a first inverter IV31, a NOR gate NR30, and a second inverter IV32. The NAND gate ND30 is configured to receive the first burst pulse BP1 and an inverted signal of a burst end signal BST_END from a third inverter IV30, and perform a NAND operation thereon. The first inverter IV31 is configured to buffer an output signal of the NAND gate ND30, and output the buffered signal as the first burst pulse BP1 in response to the clock signal CLK and the inverted clock signal CLKB. The NOR gate NR30 is configured to receive the output signal of the NAND gate ND30 and the clock signal CLK, and perform a NOR operation thereon. The second inverter IV32 is configured to buffer an output signal of the NOR gate NR30, and output the buffered signal as the second burst pulse BP2 in response to the clock signal CLK and the inverted clock signal CLKB.

When the burst end signal BST_END is at a low level, the first shifting unit 30 configured as above inverts the first burst pulse BP1, shifts the inverted first burst pulse BP1 by a half cycle of the clock signal CLK, and outputs the shifted pulse as the second burst pulse BP2. When the burst mode is set to BL4, the pulse of the burst end signal BST_END is not generated. On the other hand, when the burst mode is set to BL8, the pulse of the burst end signal BST_END is generated when three cycles of the clock signal CLK elapse from the input of the pulse of the read command RD_CMD. When the burst mode is set to BL16, the pulse of the burst end signal BST_END is generated when seven cycles of the clock signal CLK elapse from the input of the pulse of the read command RD_CMD.

The second shifting unit 31 includes a NOR gate NR31, an inverter IV33, and a logic unit 310. The NOR gate NR31 is configured to receive the second burst pulse BP2, the read command RD_CMD, and the burst command BST_CMD, and perform a NOR operation thereon to output the third burst pulse BP3. The inverter IV33 is configured to buffer an output signal of the NOR gate NR31, and output the buffered signal as the second burst pulse BP2 in response to the clock signal CLK and the inverted clock signal CLKB. The logic unit 310 is configured to receive the third burst pulse BP3 and the clock signal CLK, perform an AND operation thereon, and output the internal command INTRD_CMD.

When the read command RD_CMD and the burst command BST_CMD are not inputted, the second shifting unit 31 configured as above inverts the second burst pulse BP2, transfers the inverted pulse as the third burst pulse BP3, and outputs the third burst pulse BP3 as the internal command INTRD_CMD in a time period in which the clock signal CLK is at a high level.

Figure 7:
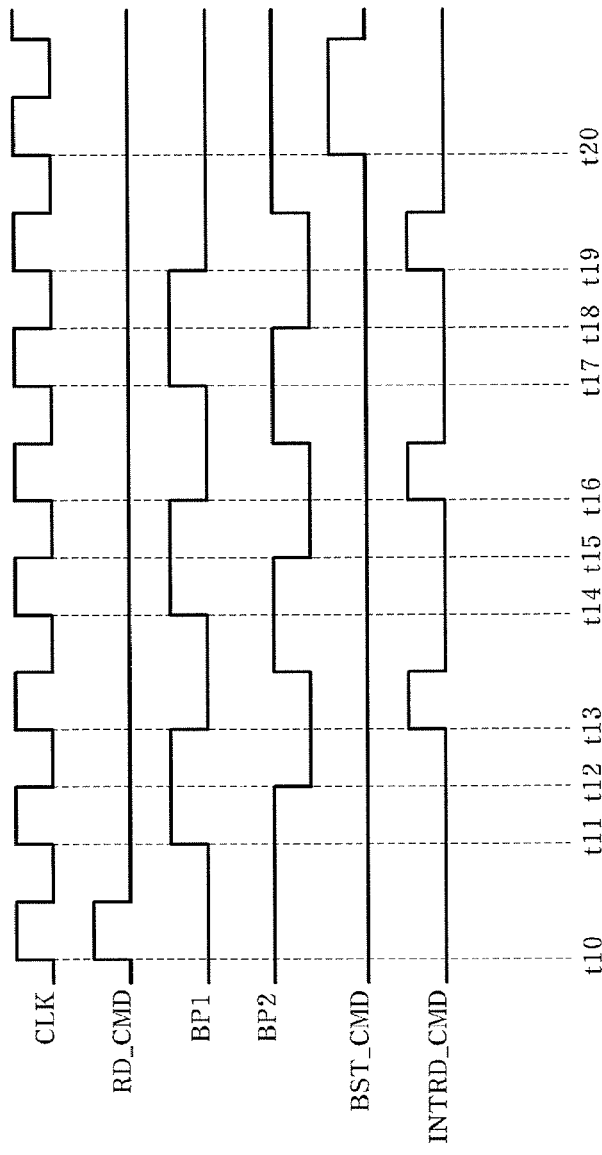
FIG. 7 is a timing diagram showing the operation of the internal command generation circuit illustrated in FIG. 4.

The operation of the internal command generation circuit configured as above will be described below. Specifically, the case of BL16 will be exemplified with reference to FIG. 7.

At time t10, when the pulse of the read command RD_CMD is inputted, the driver unit 20 drives the node nd20, which has been reset to a low level in the power-up time period, to a high level. When a half cycle of the clock signal CLK elapses after the node nd20 is driven to the high level, the latch unit 22 latches a high-level input signal and outputs a low-level signal. Thus, the NOR gate NR20 outputs a high-level signal, and the driver unit 20 changes the node nd20 to a low level. Therefore, the first burst pulse BP1 changes to a high level at time t11, and changes to a low level at time t13. That is, the first burst pulse BP1 includes a pulse having a pulse width corresponding to one cycle of the clock signal CLK.

Next, when the burst end signal BST_END is at a low level, the first shifting unit 30 inverts the first burst pulse BP1, shifts the inverted first burst pulse by a half cycle of the clock signal CLK, and outputs the shifted pulse as the second burst pulse BP2. Therefore, the second burst pulse BP2 outputted from the first shifting unit 30 changes to a low level at time t12, and changes to a high level when one cycle of the clock signal CLK elapses.

Next, when the pulse of the read command RD_CMD or the burst command BST_CMD is not inputted, the second shifting unit 31 inverts the second burst pulse BP2 and transfers the inverted second burst pulse BP2 as the third burst pulse BP3. When the clock signal CLK is at a high level, the second shifting unit 31 outputs the third burst pulse BP3 as the internal command INTRD_CMD. Therefore, the internal command INTRD_CMD outputted from the second shifting unit 31 includes a pulse which changes to a high level at time t13 and changes to a low level when a half cycle of the clock signal CLK elapses.

Next, the pulse of the internal command INTRD_CMD generated at time t13 is inputted to the burst pulse generation unit 2, and the burst pulse generation unit 2 generates the pulse of the first burst pulse BP1 having a high-level pulse width from time t14 to time t16. As described above, the pulse of the first burst pulse BP1 generates the pulse of the internal command INTRD_CMD generated at time t16.

Likewise, the pulse of the internal command INTRD_CMD generated at time t16 is inputted to the burst pulse generation unit 2, and the burst pulse generation unit 2 generates the pulse of the first burst pulse BP1 having a high-level pulse width from time t17 to time t19. As described above, the pulse of the first burst pulse BP1 generates the pulse of the internal command INTRD_CMD generated at time t19.

Next, when the high-level pulse of the burst command BST_CMD is generated at time t20, the first shifting unit 30 does not generate the second burst pulse BP2 from the first burst pulse BP1. That is, the first shifting unit 30 resets the second burst pulse BP2 to a low level.

The internal command generation circuit according to the specific embodiment of the present invention feeds back the internal command INTRD_CMD and generates the pulse until the high-level pulse of the burst command BST_CMD is generated, without using the shifter circuits which separately operate in the respective burst modes. Therefore, the internal command generation circuit according to the specific embodiment of the present invention has a small layout area and can reduce current consumption.

The construction and operation of the internal command generation circuit have been described above while being limited to the circuit which generates the internal command INTCMD in the read operation. However, it is apparent to those skilled in the art that an internal command generation circuit for generating an internal command in a write operation can be easily derived from the internal command generation circuit set forth above as the exemplary embodiment of the present invention by replacing the read command RD_CMD, which is inputted to the burst pulse generation unit 2 and the pulse shifting unit 3, with a write command WT_CMD.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An internal command generation circuit comprising:
   a first shifting unit configured to receive a first burst pulse comprising a plurality of pulses with a predetermined period, and generate a second burst pulse by shifting the first burst pulse in synchronization with a clock signal, the second burst pulse being disabled when a pulse of a burst end signal is inputted; and
   a second shifting unit configured to generate an internal command by shifting the second burst pulse in synchronization with the clock signal, the internal command being disabled when a pulse of a burst command is inputted.

2. The internal command generation circuit of claim 1, wherein, when a burst mode is set to have an 8-bit burst length BL8, then the pulse of the burst end signal is generated when three cycles of the clock signal elapse from the input of the command; and when the burst mode is set to have a 16-bit burst length BL16, then the pulse of the burst end signal is generated when seven cycles of the clock signal elapse from the input of the command.

3. The internal command generation circuit of claim 1, wherein the first shifting unit comprises:
   a first logic unit configured to receive the first burst pulse and an inverted signal of the burst end signal and perform a logic operation thereon;
   a first buffer configured to buffer an output signal of the first logic unit and transfer the buffered signal as the first burst pulse in response to the clock signal;
   a second logic unit configured to buffer the output signal of the first logic unit in response to the clock signal; and
   a second buffer configured to buffer an output signal of the second logic unit and output the buffered signal as the second burst pulse in response to the clock signal.

4. The internal command generation circuit of claim 1, wherein the burst command comprises an interrupt signal which is applied from an external circuit in order to interrupt the generation of the internal command.

5. The internal command generation circuit of claim 1, wherein the second shifting unit comprises:
   a first logic unit configured to receive the second burst pulse, the command and the burst command, and to perform a logic operation thereon;
   a buffer configured to buffer an output signal of the first logic unit and transfer the buffered signal as the second burst pulse in response to the clock signal; and
   a second logic unit configured to buffer the output signal of the first logic unit in response to the clock signal.

* * * * *